United States Patent
Herrmann

(10) Patent No.: US 8,558,743 B2
(45) Date of Patent: Oct. 15, 2013

(54) HIGH-FREQUENCY MEASUREMENT SETUP AND METHOD FOR MEASURING A HIGH-FREQUENCY TEST OBJECT

(75) Inventor: Joerg Herrmann, Neubiberg (DE)

(73) Assignee: Astrium GmbH, Taufkirchen (DE)

( * ) Notice: Subject to any disclaimer, the term of this patent is extended or adjusted under 35 U.S.C. 154(b) by 407 days.

(21) Appl. No.: 12/947,504

(22) Filed: Nov. 16, 2010

(65) Prior Publication Data

US 2011/0115683 A1    May 19, 2011

(30) Foreign Application Priority Data

Nov. 17, 2009  (DE) .......................... 10 2009 053 446

(51) Int. Cl.
  *G01R 21/10*  (2006.01)
(52) U.S. Cl.
  USPC .......................................................... 343/703
(58) Field of Classification Search
  USPC ................ 343/703; 250/216, 336.1, 395
  See application file for complete search history.

(56) References Cited

U.S. PATENT DOCUMENTS

| | | | |
|---|---|---|---|
| 3,453,633 A | | 7/1969 | Phillips |
| 5,119,105 A | * | 6/1992 | Ngai et al. ..................... 343/703 |
| 5,237,170 A | * | 8/1993 | Shatz ............................ 250/216 |
| 6,750,822 B2 | * | 6/2004 | Fritzel ........................... 343/703 |
| 2006/0220950 A1 | | 10/2006 | Morgan et al. |
| 2009/0073061 A1 | | 3/2009 | Eriksson |

FOREIGN PATENT DOCUMENTS

| | | |
|---|---|---|
| DE | 33 09 737 A1 | 9/1984 |
| DE | 199 63 794 A1 | 7/2001 |
| JP | 2001-4680 A | 1/2001 |
| WO | WO 86/06550 A1 | 11/1986 |

OTHER PUBLICATIONS

European Search Report with English Translation dated Mar. 23, 2012 (eight (8) pages).

* cited by examiner

*Primary Examiner* — Hoang V Nguyen

(74) *Attorney, Agent, or Firm* — Crowell & Moring LLP

(57) ABSTRACT

A high-frequency measurement setup for measuring a high-frequency test object, in particular, an antenna is provided. The setup includes one or more reflectors for high-frequency signals, a laser tracker, retrotargets for laser beams of the laser tracker that are disposed on the reflectors and are provided to orient the high-frequency test object, and a measuring unit that is designed to actuate the laser tracker in such a way that the high-frequency test object and one or more reflectors are measured in terms of their propagation of high-frequency signals.

14 Claims, 2 Drawing Sheets

HIGH-FREQUENCY MEASUREMENT SETUP AND METHOD FOR MEASURING A HIGH-FREQUENCY TEST OBJECT

CROSS REFERENCE TO RELATED APPLICATIONS

This application which claims priority under 35 U.S.C. §119 to German Patent Application No. 10 2009 053 446.6-35, filed Nov. 17, 2009, the entire disclosure of which is herein expressly incorporated by reference.

BACKGROUND AND SUMMARY OF THE INVENTION

The invention relates to a high-frequency measurement setup and to a method for measuring a high-frequency test object, in particular, an antenna.

High-frequency (HF) test objects, in particular, antennas, such as, for example, satellite antennas, are analyzed in terms of their HF properties in high-frequency measurement setups and antenna measurement setups. An HF measurement setup, called Compensated Compact Range (CCR), has been created by the assignee to implement highly precise measurements of antennas. To implement the measurement, the setup supplies an HF signal that has a defined direction of propagation (boresight). Each HF test object, in particular, an antenna, must be aligned parallel to this HF signal in order to obtain the most exact measurements possible. Thus, a mechanical alignment of an HF test object is generally still necessary after the HF measurement setup has been installed.

Previously, at least two theodolites have been employed, as has been described, for example, in US/2009/0073061A1. The two theodolites measure corresponding orientation points on the HF test object and a mirror cube in the measurement setup for the direction of the HF signal, the mirror cube defining the direction of propagation of the HF signal. Time-consuming geometric-optical calculations must be performed in order to compute the alignment of the HF test object in terms of the HF signal's direction of propagation. The specular directions of the mirror cube of the measurement setup must be combined with the 3D coordinates of the HF test object in order to determine corresponding corrections in the rotations of the HF test object. One disadvantage of this method of measurement for adjusting the alignment of the HF test object is a relatively significant lack of precision in the in the individual measurements, as well as in a relatively imprecise alignment of the HF test object in the measurement setup in terms of the HF measurement direction (boresight). Another disadvantage is the high cost in terms of time and personnel in performing the measurements and determining the correction values for adjusting the HF test object.

Exemplary embodiments of the present invention provide an improved high-frequency measurement setup and an improved method for measuring a high-frequency test object, in particular, an antenna.

Exemplary embodiments of the present invention use a laser tracker to measure an HF test object, or one or more reflectors of a HF measurement setup, in terms of their direction of propagation (boresight) for HF signals. The alignment of the HF test object can be adjusted depending on the measurements—in particular, in such a way that deviations from a specified or desired alignment can be reduced. In order to effect an optimal measurement using laser trackers, retrotargets are provided on reflectors to define the propagation direction of an HF signal from a measurement setup for HF test objects, while retrotargets are provided on the HF test object to define the propagation direction of the HF signal from the HF test object such as an antenna. Retrotargets are reflectors that reflect an incident laser beam back—in particular, in its direction of incidence. Exemplary embodiments of the present invention provide a relatively precise alignment of an HF test object in terms of an HF measurement direction (boresight) and a significant reduction in the cost/effort required to align the HF test object as compared with the above-described method.

In one aspect, the present invention in fact involves a high-frequency measurement setup for measuring a high-frequency test object, in particular, an antenna, comprising
  one or more reflectors for high-frequency signals
  a laser tracker
  retrotargets for laser beams of the laser tracker that are disposed on the reflectors and are provided to be disposed on the high-frequency test object,
  and
  a measuring unit that is designed to actuate the laser tracker in such a way that the high-frequency test object, and one or more reflectors, are measured in terms of their propagation of high-frequency signals (boresight).

The measuring unit can furthermore be designed to calculate and output correction values for the alignment of the high-frequency test object by using a best-fit transformation program based on the laser tracker measurements. The correction values can be displayed, for example, on a monitor, thereby allowing service personnel to align the high-frequency test object. The correction values can also be outputted through an interface for further processing by, for example, a control system of the high-frequency test object.

In addition, an adjustment device can be provided for the high-frequency test object, and the measuring unit can be designed so as to control the adjustment device in such a way that deviations are reduced in the propagation of high-frequency signals of the high-frequency test object from a specified alignment in terms of the propagation of the high-frequency signals from the reflectors. This approach enables a virtually automatic adjustment of the high-frequency test object in the measurement setup to be achieved.

Four retrotargets each can be provided on the high-frequency test object and on each reflector, the retrotargets being disposed at the corners or on edges of the high-frequency test object and of the reflectors.

The retrotargets can be designed such that they reflect an incident laser beam approximately back in the direction of incidence.

Another aspect of the present invention involves a method for measuring a high-frequency test object, in particular, an antenna, which method includes the following step:
  Actuating a laser tracker, and measuring the high-frequency test object and one or more reflectors in terms of their propagation of high-frequency signals.
In addition, the method can involve the following steps:
  Calculating correction values based on the laser tracker measurements for aligning the high-frequency test object using a best-fit transformation program, and
  Outputting the calculated correction values.
In addition, the method can involve the following steps:
  Controlling an adjustment device for the high-frequency test object depending on the measurements in such a way the deviations are reduced in the propagation of the high-frequency signals of the high-frequency test object from a specified alignment in terms of the propagation of high-frequency signals from the reflectors.
In another aspect, the present invention involves a computer program for implementing the method according to the invention and as described above, when the computer program is implemented on a computer.

In addition, one aspect of the present invention involves a non-transitory data medium on which the computer program according to the invention, and as described above, is stored. The non-transitory data medium can be, for example, a magnetic or optical storage medium or a semiconductor storage mechanism. A non-transitory data medium can include a network data storage mechanism, for example, a server that is accessible through a computer network, such as, for example, the Internet. The computer program can be stored on this network storage mechanism for download to a local computer.

Additional advantages and applications of this invention are revealed in the following description in combination with the embodiments illustrated in the drawings.

The terminology used in the list of reference numerals provided at the back, and the associated reference numerals, are used in the description, in the claims, in the abstract, and in the drawings.

DETAILED DESCRIPTION OF THE DRAWINGS

Figure 1:
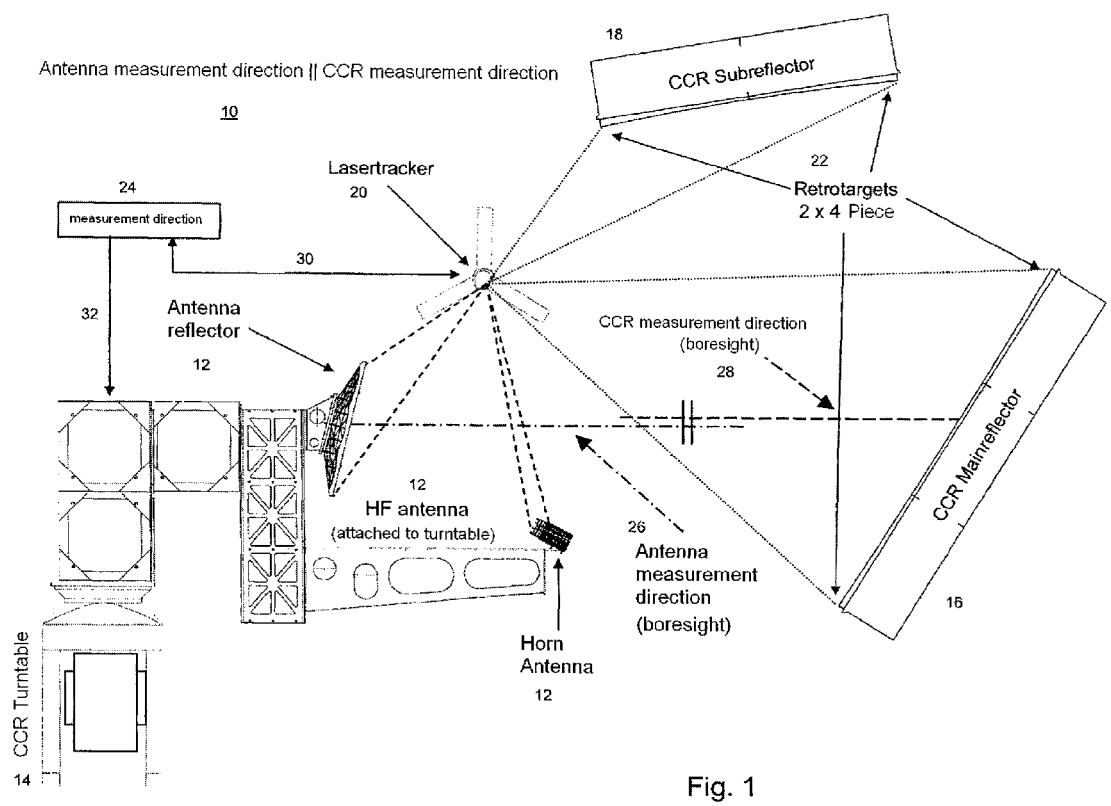
FIG. 1 is a schematic block diagram illustrating an embodiment of a CCR high-frequency measurement setup for measuring an antenna mounted on a CCR turntable according to the invention.

Identical, functionally identical, and functionally interrelated elements in the following description can be provided with the same reference numerals. Any absolute values are indicated below only by way of example and are not understood to restrict the invention.

FIG. 1 illustrates an antenna measurement setup 10 for an antenna, e.g., HF antenna, that includes an antenna reflector 12 and horn antennas 12, both of which being attached to a CCR turntable 14. Measurement setup 10 furthermore includes a CCR main reflector 16 and a CCR subreflector 18. The arrangement of main reflector 16 and subreflector 18 is found in FIG. 1.

In addition, the system has a laser tracker 20 that generates laser beams to measure the reflectors. The laser tracker emits laser pulses with the laser beams to measure the distance from retrotargets 22 that are disposed on the reflectors. Retrotargets 22 reflect the incident laser beams with the laser pulses back to laser tracker 20 that is able to use the propagation time of the laser pulses to determine the distance between laser tracker 20 and reflecting retrotarget 22. In addition to the distance, laser tracker 20 determines the angular values for retrotargets 22 in terms of the position of laser tracker 20. The 3D positions of retrotargets 22 can thus be determined using laser tracker 20.

Four retrotargets 22 each are disposed at the corners of main reflector 16 and subreflector 18. The 8 retrotargets 22 on the main reflector and subreflector, respectively 16, 18, use their 3D coordinates to define the propagation direction of the HF signal (boresight) 28 of measurement setup 10. The retrotargets on antenna reflector 12 define the propagation direction 26 of the HF signal for antenna 12 to be measured.

In addition, a measurement device 24 to control laser tracker 20 is provided. Measurement device 24 can furthermore be designed to control CCR turntable 14. Measurement device 14 first actuates laser tracker 20 to measure retrotargets 22 of main reflector 16 and of subreflector 18. The device then actuates laser tracker 20 to measure the retrotargets on the HF test object, i.e., on antenna reflector 12. During an HF test, the propagation directions of the HF signals from antenna 12 and measurement setup 10 must run to the greatest extent possible parallel to each other in order to be able to obtain the most precise possible measurement results for measured antenna 12. In order to ensure this occurs, measurement device 24 uses the measurements from retrotargets 22 of antenna 12 and measurement setup 10 within a few seconds to determine correction values that are calculated by a best-fit transformation program. The angular deviations resulting therefrom are then minimized with the high-precision turntable 14 on which antenna 12 is attached, and subsequently have a maximum deviation of only approximately 0.003°. Measuring device 24 can use the correction values to generate control signals 32 to actuate turntable 14 accordingly so as to effect appropriate adjustment of antenna 12.

Figure 2:
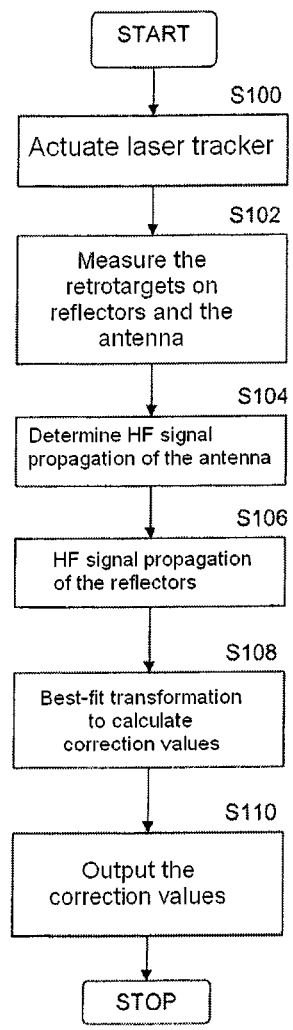
FIG. 2 is a flow chart illustrating an embodiment of the method for measuring an adjustable antenna according to the invention.

FIG. 2 is a flow chart illustrating a method for measuring an adjustable antenna, e.g., HF antenna, such as can be implemented, for example, in measurement device 24 of antenna measurement setup 10 of FIG. 1 in the form of a computer program for a measurement and control computer of measurement setup 10. In a first step S100, laser tracker 20 is actuated by the program to measure retrotargets 22. In the next step S102, the 3D coordinates are determined for retrotargets 22 on reflectors 16 and 18, and on antenna reflector 12. These 3D coordinates are the basis in step S104 for determining the propagation direction of the HF signal from measured antenna 12, and determining this direction from reflectors 16 and 18 in step S106. Correction values for the determined propagation directions are then calculated in step S108 using a best-fit transformation program and outputted in step S110. The calculated correction values can be displayed on a monitor for service personnel, or used directly to generate control signals for the turntable.

This invention enables minimization of errors in the alignment of an HF test object, such as an antenna in a high-frequency measurement system, in terms of the direction of measurement (boresight), which errors are always present after subjective measurements using theodolites. In addition, the approach can achieve a significant savings in time when preparing the alignment measurement for an HF test object such as an antenna—in particular, during the actual alignment but also during the subsequent analysis of data. Trials have demonstrated that a reduction can be achieved in the setup times of around 75%, and also of at least 30% in the actual alignment measurement and subsequent data analysis.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF REFERENCE NUMERALS 10 antenna measurement setup
12 antenna reflector and horn antennas of the antenna to be measured
14 CCR turntable
16 CCR main reflector
18 CCR subreflector
20 laser tracker 22 retrotargets
24 measurement device
26 propagation direction of the HF signals in the antenna measurement direction (boresight)
28 propagation direction of the HF signals in the CCR measurement direction (boresight)
30 measurement and control signals
32 control signals for CCR turntable 14
S100-S110 procedural steps

What is claimed is:

1. A high-frequency measurement setup for measuring a high-frequency test object, the setup comprising:
   one or more reflectors for high-frequency signals;
   a laser tracker;
   retrotargets for laser beams of the laser tracker that are disposed on the reflectors and are provided to orient the high-frequency test object; and
   a measuring unit that actuates the laser tracker in such a way that the high-frequency test object and one or more reflectors are measured in terms of their propagation of high-frequency signals.

2. The setup according to claim 1, wherein the measuring unit uses a best-fit transformation program to calculate and to output correction values based on the laser tracker measurements for aligning the high-frequency test object.

3. The setup according to claim 1, further comprising:
   an adjustment device for the high-frequency test object, wherein the measuring unit controls the adjustment device so as to reduce deviations in the propagation of high-frequency signals of the high-frequency test object from a specified alignment in terms of the propagation of the high-frequency signals from the reflectors.

4. The setup according to claim 1, wherein four retrotargets each are provided on the high-frequency test object and on each reflector, the retrotargets being disposed at the corners or at the edges of the high-frequency test object and the reflectors.

5. The setup according to claim 1, wherein the retrotargets are arranged to reflect an incident laser beam back approximately in its direction of incidence.

6. The setup according to claim 1, wherein the high-frequency test object is an antenna.

7. A method for measuring a high-frequency test object, comprising:
   actuating a laser tracker to emit laser beams on the high-frequency test object and on retrotargets disposed on one or more reflectors; and
   measuring the high-frequency test object and the one or more reflectors in terms of their propagation of high-frequency signals using the laser beams incident on the high-frequency test object and on the retrotargets disposed on the one or more reflectors.

8. The method according to claim 7, further comprising:
   calculating correction values based on the laser tracker measurements for aligning the high-frequency test object using a best-fit transformation program, and
   outputting the calculated correction values.

9. The method according to claim 7, further comprising:
   controlling an adjustment device for the high-frequency test object based on the measurements so as to reduce deviations in the propagation of high-frequency signals of the high-frequency test object from a specified alignment in terms of the propagation of the high-frequency signals from the reflectors.

10. The method according to claim 7, wherein the high-frequency test object is an antenna.

11. A non-transitory computer-readable medium including a computer program, which when executed by a computer:
    actuates a laser tracker to emit laser beams on the high-frequency test object and on retrotargets disposed on one or more reflectors; and
    measures the high-frequency test object and the one or more reflectors in terms of their propagation of high-frequency signals using the laser beams incident on the high-frequency test object and on the retrotargets disposed on the one or more reflectors.

12. A non-transitory computer-readable medium according to claim 11, wherein the computer program when executed by a computer:
    calculates correction values based on the laser tracker measurements for aligning the high-frequency test object using a best-fit transformation program, and
    outputs the calculated correction values.

13. A non-transitory computer-readable medium according to claim 11, wherein the computer program when executed by a computer:
    controls an adjustment device for the high-frequency test object based on the measurements so as to reduce deviations in the propagation of high-frequency signals of the high-frequency test object from a specified alignment in terms of the propagation of the high-frequency signals from the reflectors.

14. A non-transitory computer-readable medium according to claim 11, wherein the high-frequency test object is an antenna.

* * * * *